March 15, 1949. J. I. BELLAMY Re. 23,089

ELECTROMAGNETIC COUNTING DEVICE

Original Filed July 2, 1943 5 Sheets-Sheet 1

Inventor:
John I. Bellamy
By C. A. Soper
Atty.

March 15, 1949. J. I. BELLAMY Re. 23,089

ELECTROMAGNETIC COUNTING DEVICE

Original Filed July 2, 1943 5 Sheets-Sheet 2

Inventor:
John I. Bellamy
By C. R. Soper
Atty.

March 15, 1949. J. I. BELLAMY Re. 23,089
ELECTROMAGNETIC COUNTING DEVICE
Original Filed July 2, 1943 5 Sheets-Sheet 3
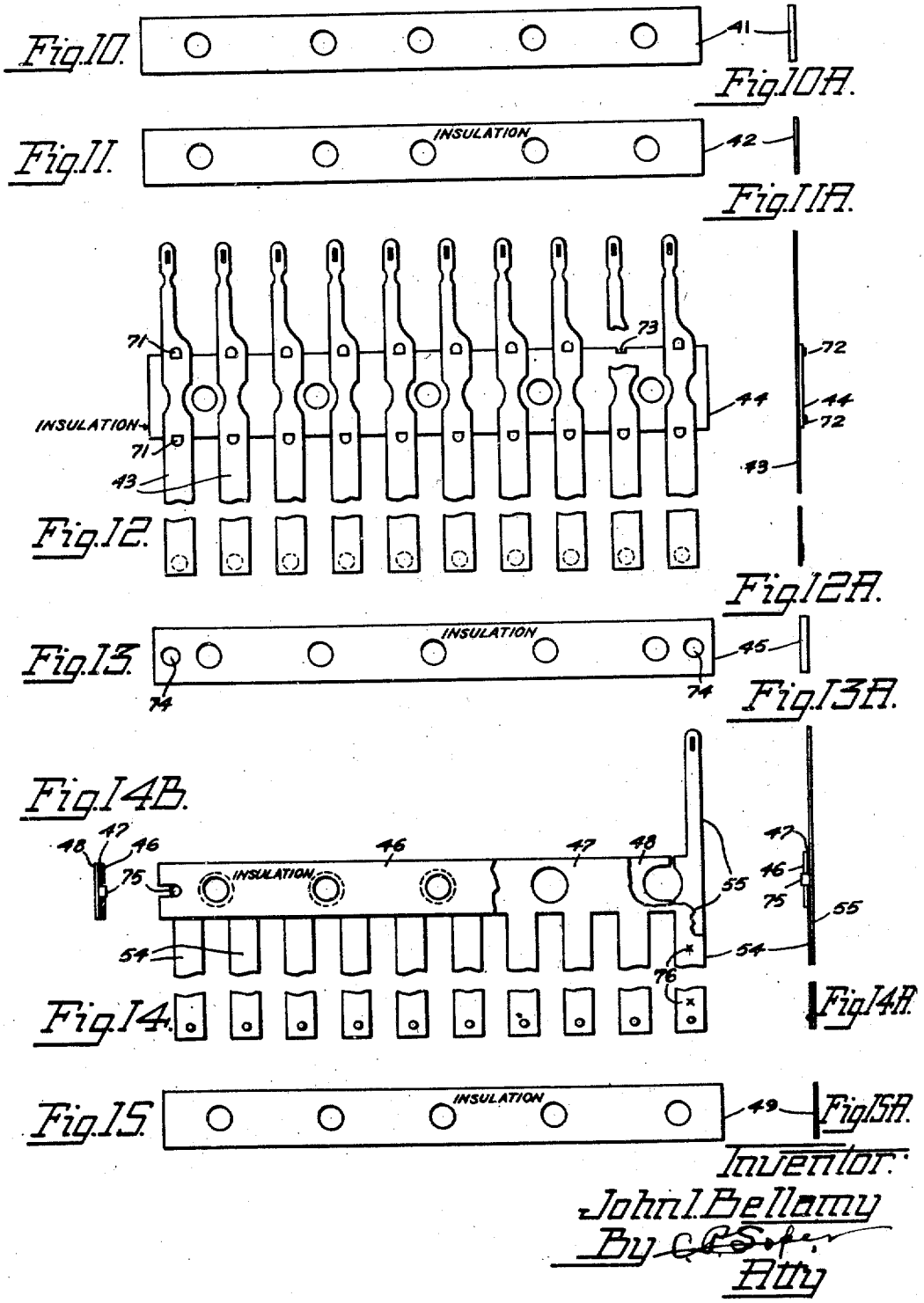
Inventor:
John I. Bellamy
By C. C. Soper
Atty March 15, 1949. J. I. BELLAMY Re. 23,089
ELECTROMAGNETIC COUNTING DEVICE
Original Filed July 2, 1943 5 Sheets-Sheet 4
Fig.16.
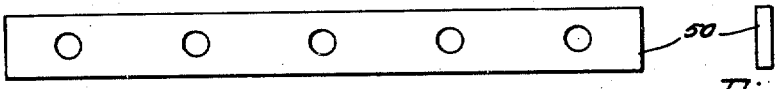
Fig.16A.
Fig.17.
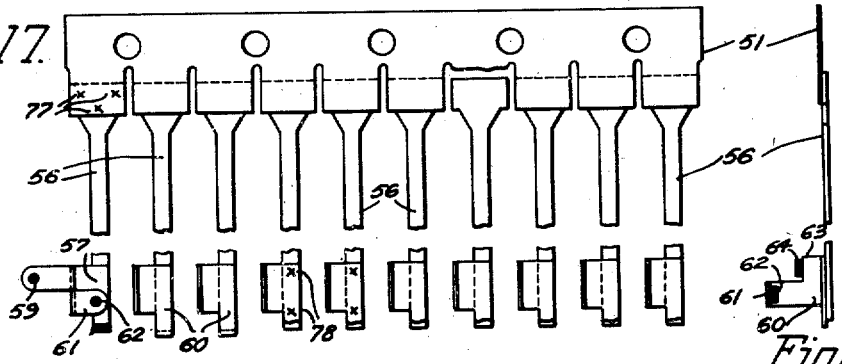
Fig.17A.
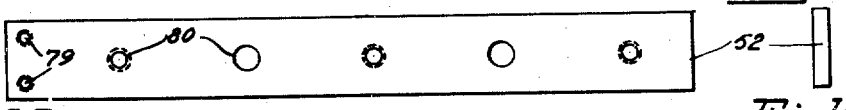
Fig.18.
Fig.18A
Fig.19.
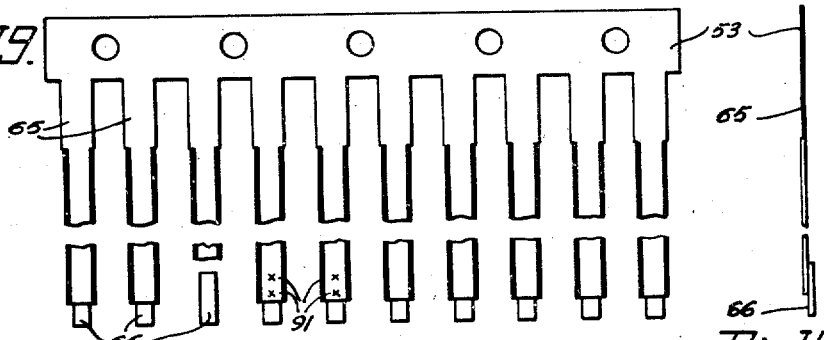
Fig.19A.
Fig.20.
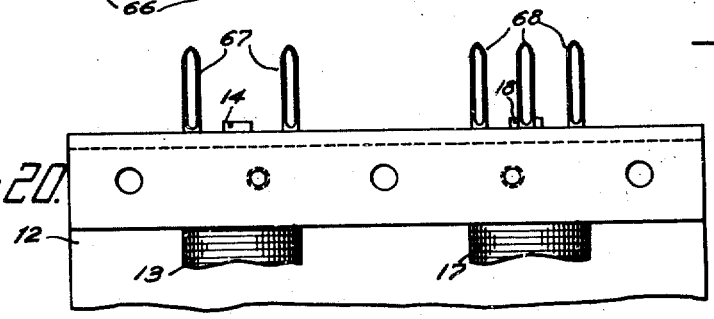
Inventor:
John I. Bellamy
By C. C. Sofer
Atty.

March 15, 1949. J. I. BELLAMY Re. 23,089
ELECTROMAGNETIC COUNTING DEVICE
Original Filed July 2, 1943 5 Sheets-Sheet 5
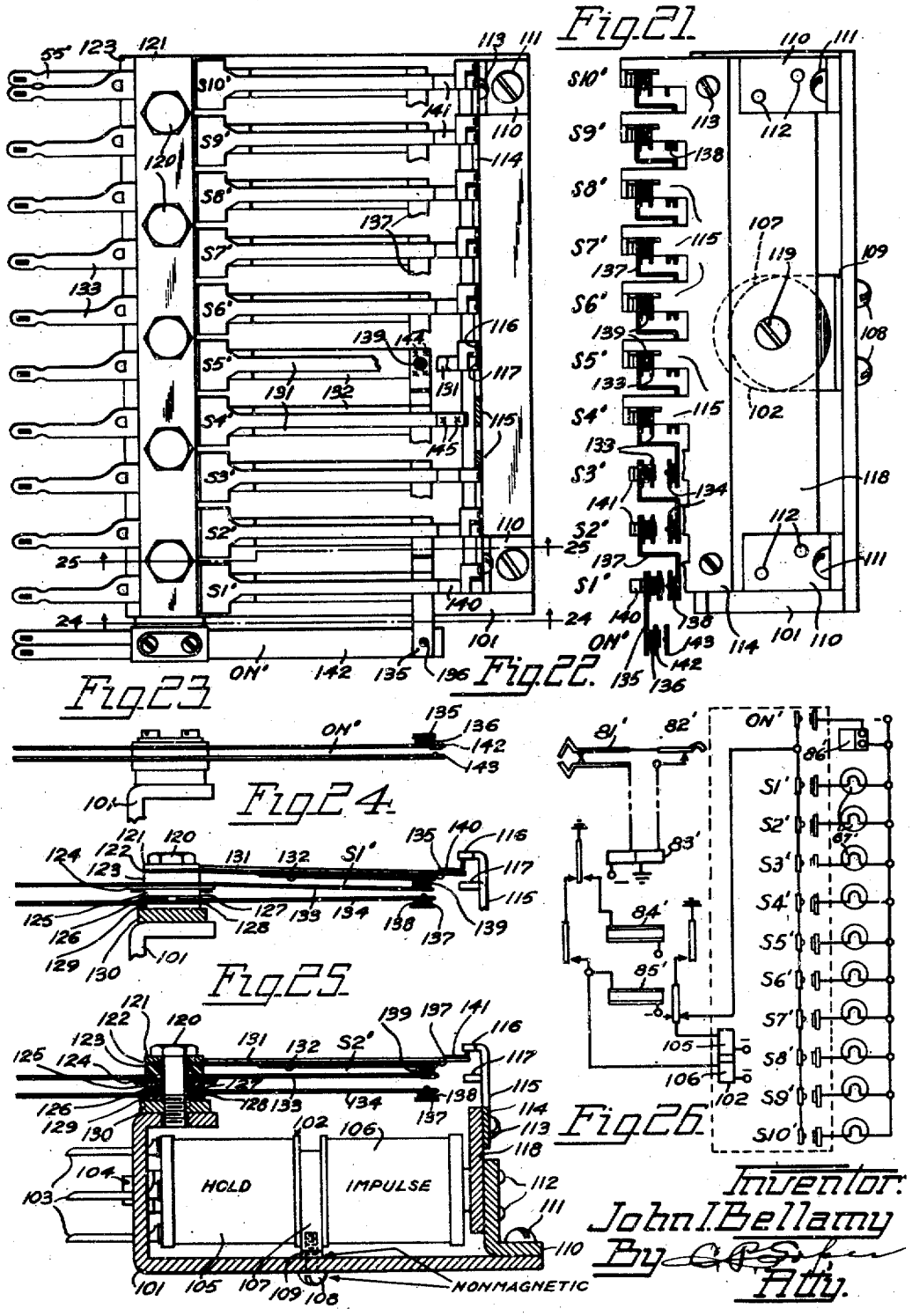
Inventor:
John I. Bellamy
By C. C. Parker
Att'y.

Reissued Mar. 15, 1949 Re. 23,089

UNITED STATES PATENT OFFICE 23,089

ELECTROMAGNETIC COUNTING DEVICE

John I. Bellamy, Wheaton, Ill., assignor to Kellogg Switchboard and Supply Company, Chicago, Ill., a corporation of Illinois Original No. 2,441,001, dated May 4, 1948, Serial No. 493,312, July 2, 1943. Application for reissue August 28, 1948, Serial No. 46,621

20 Claims. (Cl. 177—353)

This invention relates to electromagnetic counting devices. Its object is to provide a simple and reliable electromagnetic device for counting received electrical impulses, and for controlling electrical contacts in accordance with the number of impulses in a counted series.

General Description

Electromagnetic devices for counting received electrical impulses fall generally into two classes—progressively movable and successively movable.

In a counting device of the progressively movable class, a single responding member is progressively moved in response to received impulses, being actuated usually through the well-known pawl and ratchet mechanism. Such devices are considered undesirable for many purposes, because of the inherent inertia of progressively movable stepping mechanisms, and because of their unreliability when not accurately manufactured and frequently serviced.

In a counting device of the successively movable class members are provided either equal to or double the maximum number of impulses to be counted. These members are caused to respond successively to the received impulses of a series. These successively responding members are usually the armatures of a chain of relays comprising what is termed a counting chain, but may be armatures responding successively to successive magnetization of a common pole structure.

A specific object of this invention is to provide an electromagnetic impulse counting device of the last-named type wherein the required number of armatures is no greater than the number of impulses counted thereby. This object is attained by providing that any armature other than the first partakes of two movements—a preparatory movement upon the cessation of the impulse serving to operate the preceding armature, and a final or executing movement upon the receipt of the impulse to which it pertains.

A further object is to provide a structure of the concerned type wherein the necessity for serially related contacts in the work or marking circuits controlled thereby is rendered unnecessary. This object is attained by providing that the second contact of a pair closed by the operation of a given armature is moved out of engagement with the first contact of such pair incidental to the executing movement of the next succeeding armature, whereby any armature after the first opens the contact pair closed by the preceding armature and closes its own contact pair. By this arrangement, an individual marking or work circuit corresponding to the last operated one of the armatures is closed, and the contact pairs associated with all preceding and succeeding armatures are in open condition; yet only a single contact pair is provided for any armature.

A feature of this arrangement is that the first or preliminary movement imparted to an armature succeeding the first is accomplished by force imparted thereto through the contact pair closed by the currently responding armature, thereby simplifying the interlocking arrangement.

A further feature is that the improved counting device performs its counting operation responsive solely to the impulses delivered to a single magnet winding.

A further specific object is to provide a device of the character under discussion wherein the armatures and cooperating contact blades, or springs, are arranged in stackups (or assemblies) disposed side by side, each such stackup containing an armature and the associated contact blades, and wherein the concerned parts are secured on economically produced mounting strips susceptible of bank assembly, each such strip containing a corresponding part for each of the stackups of the device.

Other objects and features of the invention will become more apparent as the description progresses.

*The drawings*

The accompanying drawings, comprising Figs. 1 to 26, show a first embodiment of the invention in Figs. 1 to 20 and a second embodiment of the invention in Figs. 21 to 26:

Figs. 10 to 19 show plan views of the respective parts entering into the bank assembly including armatures and contact blades;

Figs. 10A to 19A show end views, taken from the right, of the parts shown in Figs. 10 to 19;

Fig. 14B shows an end view, taken from the left, of the part shown in Fig. 14;

Fig. 20 is a plan view of the rear portion of the structure upon which the parts shown in Figs. 10 to 19 are to be assembled;

Fig. 21 is a front view of the second embodiment of the invention;

Fig. 22 is a plan view thereof;

Fig. 23 is a left-side view of a portion of the second embodiment;

Fig. 24 is a side sectional view taken along the line 24—24 of Fig. 22;

Fig. 25 is a side sectional view taken along the line 25—25 of Fig. 22; and

Fig. 26 is a circuit drawing showing the second embodiment of the device used in a signalling system.

Detailed Description

*First embodiment*

Figure 3:
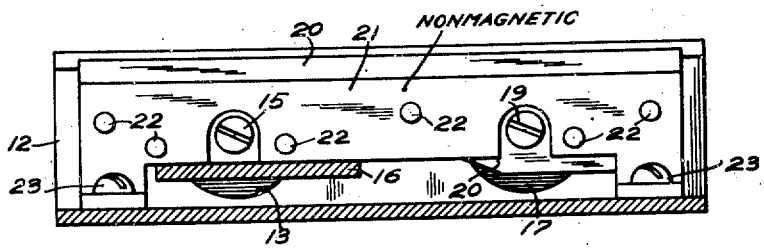
Fig. 3 is a front sectional view taken along the line 3—3 of Fig. 7.
Figure 4:
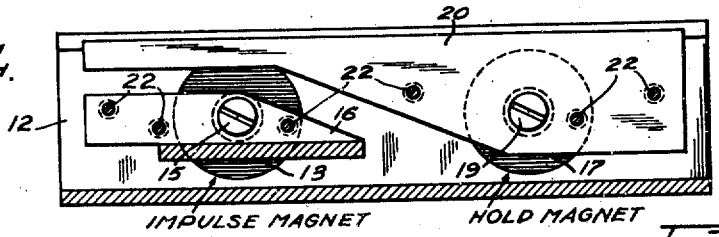
Fig. 4 is a front sectional view taken along the line 4—4 of Fig. 7.
Figure 7:
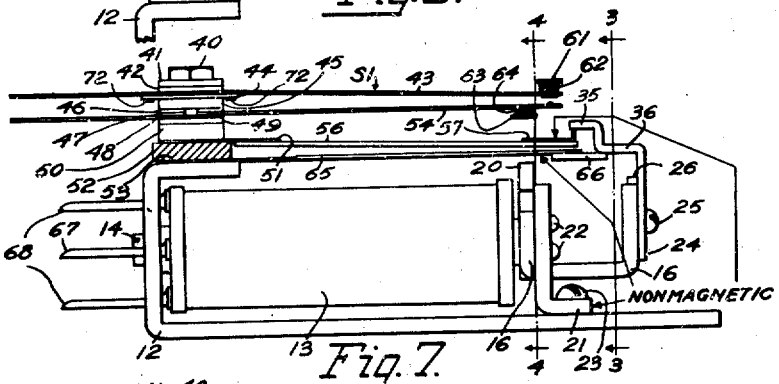
Fig. 7 is a side sectional view taken along the line 7—7 of Fig. 5.

In the first embodiment (Figs. 1 to 20), the improved electromagnetic counting device includes a pair of electromagnets 13 and 17, seen best in front view in Fig. 4. These magnets are secured at the rear to the U-shaped frame member 12 by screws 14 and 18 (Figs. 7 and 20). Frame member 12 has an upper forwardly extending horizontal portion on which the bank structure including contact springs and armatures is mounted. Member 12 has a longer lower horizontal portion, extending underneath the magnets to serve as a mounting plate or bracing structure for the pole pieces 16 and 20, as well as serving as a magnetic shield between the disclosed device and a similar device mounted directly below it.

Magnet 13 is termed the impulse magnet in that the successive impulses of a series to be counted are delivered to it, while magnet 17 is termed the hold magnet in that it is energized continuously during the counting operation and for as long a time thereafter as the indication of the number of impulses counted is to be retained.

As seen best in Fig. 4, a pole piece 16 is secured to the front end of impulse magnet 13 by screw 15, and a pole pole piece 20 is secured to the front end of hold magnet 17 by screw 19. These two pole pieces are referred to herein as the impulse bar and as the hold bar respectively. It is to be noted that the impulse bar is of oblong configuration as seen in Fig. 4, but has the lower left-hand portion removed to maintain it spaced well away from the associated portion of impulse bar 16, for magnetic isolation.

The non-magnetic bracket 21 (seen in front view at Fig. 3) serves to maintain the impulse and hold bars 16 and 20 in fixed relation to each other independent of the screws 15 and 19. Bracket 21 is secured to bars 16 and 20 by rivets 22. It is notched to provide clearance for the heads of screws 15 and 19, and it is provided with feet through which it is secured to the lower horizontal portion of frame member 12 by screws 23, thus rigidifying the structure.

Figure 2:
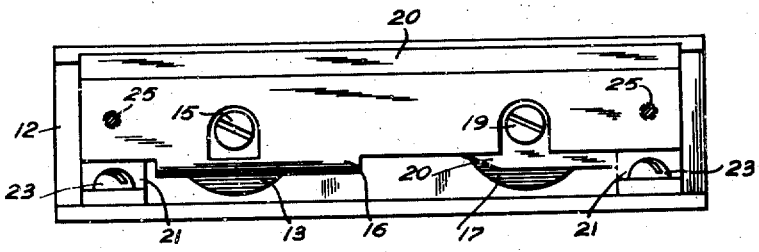
Fig. 2 is a front view with the bank assembly and part 24 removed.

As is shown in profile in Fig. 7, the impulse bar (or pole piece) 16, besides the rear portion attached to magnet 13 behind bracket 21, comprises the horizontal portion shown in cross-section in Figs. 3 and 4 and the main portion shown in full front view in Fig. 2. The front portion of the impulse bar 16 is provided with openings seen in Fig. 2 to give access to the screws 15 and 19.

Figure 1:
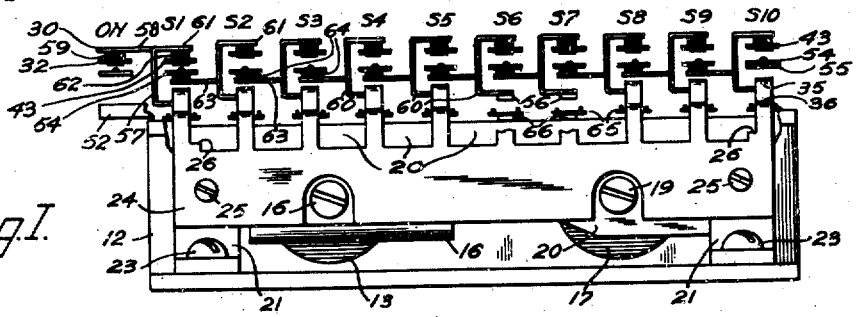
Fig. 1 shows a front view of the first embodiment of the invention.
Figure 5:
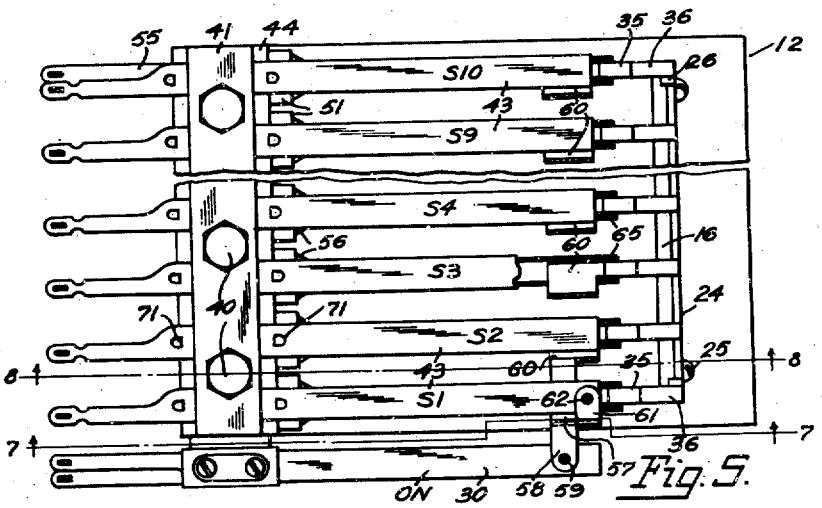
Fig. 5 is a top view.
Figure 6:
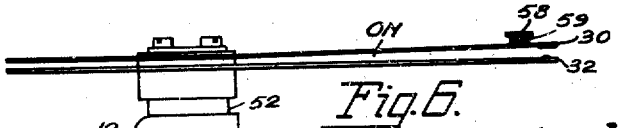
Fig. 6 is a left-side view of a portion of the device.

As is seen in Figs. 1, 5, 7, and 8, the impulse bar 16 is provided with an impulse yoke 24 attached thereto by screws 25. This yoke delivers the magnetic impulses to the armatures contained in the stackups S1 to S10 (Figs. 1 and 5). Yoke 24 is notched at the upper portion to provide ten fingers, one for each of the stackups S1 to S10. The open spaces between these fingers permit ready inspection of the parts lying to the rear thereof and permit the ready insertion of an adjusting tool. A pair of positioning lugs 26, on yoke 24, extend rearwardly to engage the upper face of impulse bar 16 (Figs. 1 and 7). These lugs are preferably held firmly in contact with the impulse bar 16 as screws 25 are being tightened, thereby definitely locating the yoke 24 with respect to the upper face of hold bar 20.

Figure 8:
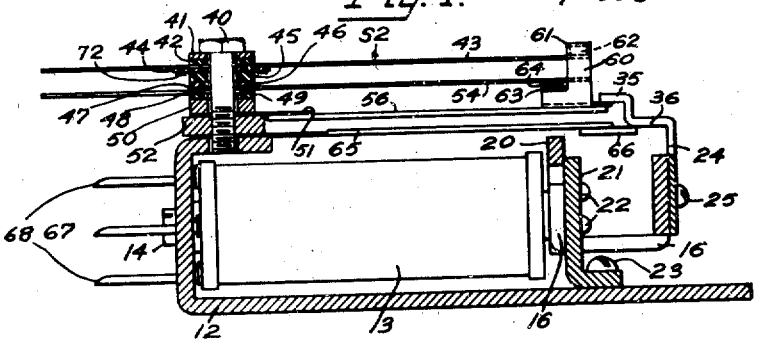
Fig. 8 is a side sectional view taken along the line 8—8 of Fig. 5.

As seen best in Figs. 7 and 8, the upper portion of impulse yoke 24 is bent rearwardly, upwardly, and again rearwardly, to provide two offset horizontal pole faces 35 and 36 for each of the ten finger portions of the yoke. It is through these pole faces that the impulses to be counted are delivered to the armatures and cooperating structure pursuant to the counting operation.

Each of the counting assemblies, or stackups, S1 to S10, mounted in a bank assembly above and to the rear of the magnet structure, comprises a pair of contact blades, or springs, 43 and 54, an armature 56, and a stop-supporting blade or spring 65, as shown in Figs. 7 and 8. The explanation of the bank construction and assembly is given hereinafter in connection with Figs. 10 to 19. It may be noted here that the contact springs 43 and 54 of any stackup are maintained insulated from each other and that the contact springs 54 of stackups S1 to S10 are in common connection with each other and with terminal 55 (Figs. 5 and 14).

Preferably, all portions of any of the stackups S1 to S10 are non-magnetic except for armature 56 and stop 66 of such stackup. The armatures 56 are spring-suspended at the rear in close proximity to base strip 51, providing a magnetic return path for any armature 56, through base strip 51, and thence to frame member 12, across the air gap represented by the thickness of the thin strip material from which stop-support blades 65 are formed.

In the operation of the device, given more fully hereinafter, when impulse magnet 13 is energized and impulse bar 16 is thereby magnetized, the magnetic flux passes through impulse yoke 24 and reaches pole faces 35 and 36 for each stackup. One portion of the flux passes thence to each armature 56 from its pole face 35 and another portion reaches such armature from its pole face 36, by way of the concerned magnetic stop 66. Flux passing through the first-named path creates an upward pull on the armature, tending to maintain it in its normal position, while flux passing through the latter path creates a downward pull, tending to bring the armature down against stop 66.

As shown in Fig. 8 for stackup S2, all of the armatures in stackups S2 to S10 are normally closer to the upper pole face 35 than they are to the pole face 36 as extended inwardly by the concerned magnetic stop 66. But, the forward end of bracket 57 on armature 56 in stackup S1 (Fig. 7) is bent upwardly sufficiently to maintain armature 56 of the first stackup S1 in a normally advanced position, nearer the stop 66 than to the pole face 35, whereby the armature of the first stackup responds to the first impulse by moving downwardly until it engages the associated stop 66. By this arrangement, only the first armature responds to the first impulse. It will be explained hereinafter how the initial downward movement of the first armature in response to the first impulse is followed by a final movement of such armature upon the cessation of the first impulse, and how this final movement of the first armature moves the second armature to an advanced position corresponding to the normal advanced position of the first armature, to condition the second armature to respond to the second impulse.

Armature 56 of the first stackup has a bracket 57 attached to the upper portion thereof, as by spotwelding. Bracket 57 has a part which extends sidewardly and upwardly as seen in Fig. 1, and which then divides into an arm 58 extending to the left to overlie the off-normal stackup ON, and an arm 61 extending to the right to overlie the contact springs of stackup S1. Insulating bushing 59, affixed to the underside of arm 58, maintains arm 58 out of engagement with the adjacent off-normal spring 30, while a similar insulating bushing 62 attached to the underside of arm 61 maintains arm 61 out of engagement with the upper contact spring 43 of stackup S1.

Each of the brackets 60, attached to the armatures 56 in stackups S2 to S10, carries a left arm 63 branching off from a lower level than the left arm 58 of bracket 57. Each of the arms 63 carries an insulating bushing 64, which underlies and supports the contact spring 54 of the preceding stackup.

In Figs. 1, 7, and 8, it will be observed that the upper face of the hold bar 20 underlies the armatures 56 to the rear of the stops 66 so as to tend to attract the armatures downwardly when the hold bar is magnetized by an energization of the hold magnet 17. In the intended operation of the device, the magnetization of bar 20 is sufficient to attract an armature 56 downwardly from stop position to final position between impulses, but is insufficient to operatively attract an armature downwardly from either its initial position or its advanced position.

Figure 9:
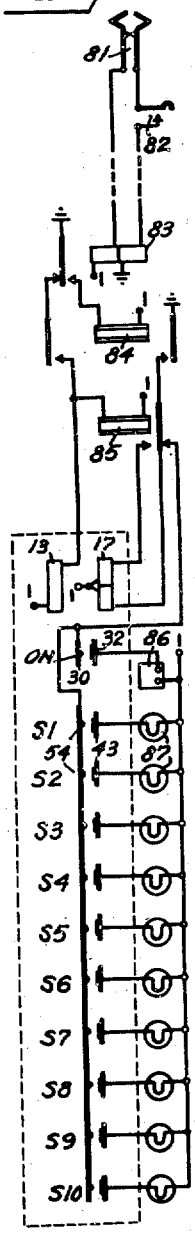
Fig. 9 is a circuit drawing showing the first embodiment of the device used in a signalling system.

In Fig. 9, which illustrates a simple signalling system including the first embodiment of the counting device, the circuit elements of the counting device are shown within the broken-line rectangle. These circuit elements include the single-wound impulse magnet 13, the double-wound hold magnet 17, contacts 30 and 32 of the off-normal stackup ON, and the contacts 43 and 54 of each of the counting stackups S1 to S10. Associated with the counting device thus illustrated are three control relays comprising a line relay 83, a release relay 84, and a series relay 85. Each of the relays 84 and 85 is slow-restoring as is indicated by the conventional representation of a conducting sleeve surrounding the core of the relay beneath its winding. The line over which line relay 83 is controlled is illustrated as containing a normally open key 82, and a telephone-type calling device whose interrupter contacts are illustrated diagrammatically at 81. Such a calling device is arranged to transmit any desired series of interruption impulses from 1 to 10, as is well known.

A buzzer 86 is shown interconnected with the off-normal contacts, and signal lamps 87 are shown interconnected with the counting contacts.

*Operation*

When a signal is to be transmitted over the line illustrated in Fig. 9, key 82 is first closed, thereby operating line relay 83, which in turn operates the slow-restoring release relay 84. Release relay 84 prepares the impulse circuit at its left contacts, while at its right contacts it energizes one winding of magnet 17. This energization of hold magnet 17 is sufficient to maintain all armatures 56 in fully operated position.

When the dial (not shown) which controls contacts 81 is rotated forwardly to the desired position and then released, it causes contacts 81 to be interrupted on the return movement thereof a number of times depending upon the digit value in accordance with which such dial was operated. The interruptions thereby produced are each of only momentary length and they are separated by only a momentary interval, as is well understood. Line relay 83 is thereby restored momentarily a corresponding number of times. Being slow-restoring, release relay 84 remains operated.

Each time it restores, line relay 83 transmits an impulse to the winding of series relay 85 and an impulse to the winding of impulse magnet 13. Impulse magnet 13 is thus momentarily energized once for each interruption of the circuit at contacts 81. Series relay 85 responds to the first impulse. Being slow-restoring, it remains operated throughout the series of impulses and then restores a moment later.

Upon operating, series relay 85 disconnects off-normal contacts 32 and counting contacts 54 from the front contact of the upper armature of release relay 84 to avoid a preliminary sounding of the buzzer 86 and to avoid momentary flashing of the lamps 87 passed over by the counting operation.

Relay 85 also closes a circuit for the other winding of magnet 17, through the front contact of the right-hand armature of relay 84, thereby increasing the energization of hold magnet 17 sufficiently to enable it to bring about the final movement of any of the armatures 56 which are moved from advanced position to stop position responsive to an energization of impulse magnet 13.

Returning now to the structural ones of the drawings, Figs. 1 to 20, no immediate effect is produced by the preliminary energization of the first winding of hold magnet 17 incidental to the operation of release relay 84, nor is any immediate effect produced incidental to the increased energization of hold magnet 17 incidental to the operation of series relay 85.

*First impulse received*

Responsive to the magnetization of impulse bar 16 and impulse yoke 24 upon the delivery of the first impulse to magnet 13, armature 56 in stackup S1 is attracted downwardly because (in its normally advanced position) it stands nearer the upper surface of its stop 66 than it does to its pole face 35. The downward movement of armature 56 is arrested when the forward end thereof encounters the upper surface of spring 65 to which the stop 66 is attached, as by spotwelding. The separation at that time between the armature 56 and stop 66 is the thickness of the thin material of which spring 65 is composed. This spring is stiffened throughout the major portion of its length by having the side portions upturned (Figs. 1, 5, 7, and 19). Armature 56 passes freely between these upturned sides. None of the armatures 56 of the remaining stackups is operated at this time because each is nearer its associated pole face 35 than it is to its associated stop 66, and is therefore urged upwardly to remain in normal position.

By being thus moved downwardly from advanced position into stop position, armature 56 of stackup S1 is brought within the effective field of influence of the upper face of the now strongly energized hold bar 20, but no further downward movement of the armature occurs for the time being, for the concerned stop 66 is held in its illustrated normal position by the flux interlinkage between the forward portion of its upper face and the pole face 36 with which it is in contact.

Responsive to the movement of armature 56 of stackup S1 into stop position, the attached arm 58 moves off-normal contact spring 30 downwardly just sufficiently to make contact with contact spring 32. At the same time, the attached arm 61 moves contact spring 43 of stackup S1 downwardly just sufficiently to make contact with contact spring 54 of such stackup.

*First impulse terminated*

When the first impulse is terminated, and impulse bar 16 and impulse yoke 24 are consequently demagnetized, the flux interlinkage in stackup S1 between pole face 36 and stop 66 ceases, freeing the stop. Since the armature 56 of stackup S1 is in stop position, within the effective field of hold bar 20, such armature 56 is immediately attracted downwardly (carrying stop 66 before it) until the lower face of the associated stop-support spring 65 is brought into engagement with the upper face of hold bar 20. Such armature 56 is then in its final position, one impulse having been received and counted.

Bracket 57 partakes of the final movement of armature 56 of stackup S1. Its arm 58 presses contact spring 30 more firmly into engagement with contact spring 32 of the off-normal stackup, contact spring 32 yielding to permit the downward movement. Contact spring 32 may be made of any desired thickness according to the contact pressure desired between the contact portions of springs 30 and 32.

Arm 61 of bracket 57, acting through its insulating bushing 62, bends spring 43 in stackup S1 downwardly by an amount equal to the executing movement of the associated armature 56, thereby pressing the concerned contact springs 43 and 54 more firmly into engagement. With these contact springs already in engagement at the beginning of the executing movement, contact spring 54 is moved downwardly a distance equal to the final movement of the associated armature, whereby the desired contact pressure between the contacts of the concerned springs 43 and 54 is applied. At this point, it should be noted that the lower contact springs 54 of the stackups S1 to S10 are preferably composed of comparatively thin sheet material, which requires but little flexing pressure. Moreover, the contact springs 54 are preferably tensioned downwardly slightly, each against the upper face of its underlying bushing 64. Such contact springs accordingly rest lightly on the respective bushings 64, and do not of themselves resist downward movement. The resistance to the downward movement necessary to build up the desired contact pressure between the contacts of a pair of springs 43 and 54 is secured by the normal upward tension of the contact springs 43, of stackups S2 to S10. Each such contact spring is so tensioned that it normally urges its overlying bushing 62 upwardly by an amount about equal to the desired contact pressure.

As the spring 54 in stackup S1 is forced downwardly by spring 43, during the final movement of the associated armature 56, the concerned spring 54, through the underlying insulating bushing 64, forces downwardly the arm 63 attached to bracket 60 carried by the armature 56 in stackup S2, thereby forcing downwardly such bracket 60 and attached armature a distance equal to the final movement of the armature in the first stackup. Arm 61 in stackup S2, through its underlying insulating bushing 62, moves the associated upper contact spring 43 downwardly against the trapped upward pressure of the latter, but not a sufficient distance to engage its associated lower contact spring 54. Armature 56 in stackup S2 partakes of the downward movement of the attached bracket 60, whereby it is moved to its advance position, below the midpoint between the associated lower face 35 and the upper face of its stop 66. It then occupies an advanced position between these two pole faces substantially as illustrated in Fig. 7 as the normal advanced position of the armature 56 in stackup S1.

*Second impulse received*

If the impulse series being counted contains a second impulse, upon the receipt of such second impulse by magnet 13 and the consequent energization of impulse bar 16 and attached yoke 24, armature 56 of stackup S2, being in its above-described advanced position below the magnetic center line is attracted downwardly into its stop position, in engagement with its associated stop 66. Bracket 60, attached to the armature of stackup S2, is moved downwardly a like distance, thereby carrying downwardly its arms 61 and 63. Such arm 63 carries downwardly its overlying insulating bushing 64, thereby removing the support from the lower contact spring 54 of stackup S1. Since such contact spring 54 is lightly tensioned downwardly, it immediately moves out of contact with the associated upper contact spring 43 in stackup S1 by an amount equal to the intermediate movement of the armature in stackup S2. This breaking of the contact in stackup S1 occurs at the beginning of the intermediate movement in stackup S2.

Arm 61 of bracket 60 associated with stackup S2, upon partaking of the intermediate movement of the associated armature, moves the associated upper contact spring 43 downwardly just sufficiently to come into contact with the associated contact spring 54 in stackup S2, which contact is made at the termination of the concerned intermediate movement, whereas the contact between the springs 43 and 54 of stackup S1 is broken as above described at the beginning of such movement. There is, therefore, no overlap period during which two adjacent contact pairs are closed. Accordingly, the device may be used in a situation where a number of them operate to control successively a common group of conductors, and the one being operated will then not interfere with a control being effected by another similar device. One example of an arrangement requiring this feature of non-interference between similar counting devices is found in Patent No. 1,683,857, issued September 16, 1928, to Bellamy and Gardner (see Figs. 3 and 5).

*Second impulse terminated*

Upon the termination of the second impulse, the armature 56 of stackup S2, having been advanced to stop position, within the effective field of influence of the upper face of hold bar 20, is moved downwardly into contact with the hold bar except for the separation between the armature and the hold bar representing the thickness of the sheet material of which the associated stop-support spring is constructed. The associated stop 66 is thereby carried downwardly out of engagement with the associated face 36 of yoke 24, introducing a substantial break in the magnetic circuit through the stop and the impulse yoke.

As an incident to the final movement of the armature of stackup S2, the upper contact spring 43 of stackup S2 is given its final downward movement. Since the springs 43 and 54 of this stackup are in contact, the lower contact spring of such stackup partakes of the final movement and imparts it to arm 63 of stackup S3, whereby the concerned bracket 60 moves the armature of stackup S3 into its advanced position, as previously described for the armature of stackup S2.

*Succeeding impulses*

If the impulse series under consideration contains succeeding impulses, the armatures of the concerned succeeding stackups S3 to S10 respond thereto as described hereinbefore for stackup S2. That is, each such armature executes its advance movement responsive to the final movement of the preceding armature, upon the termination of the impulse pertaining to such preceding armature; executes its intermediate movement responsive to the receipt of the impulse pertaining thereto; and executes its final movement responsive to the cessation of such impulse. The contact pair directly associated with any such armature is not closed responsive to the advance movement of such armature; is preferably barely closed responsive to the completion of the intermediate movement of such armature; is more firmly closed, to build up the desired contact pressure, responsive to the final movement of such armature; and is again opened responsive to the beginning of the intermediate movement of the next succeeding armature, if a further impulse is received.

When line relay 83 (Fig. 9) comes to rest at the end of the series of impulses, it again closes the circuit of release relay 84 steadily, and maintains open the circuit of impulse magnet 13 and series relay 85. Relay 85 restores a moment later. Upon so doing, it open-circuits the second winding of hold magnet 17, thereby reducing the current drain of this magnet to an economical value, leaving the magnet energized by its first winding sufficiently to maintain any fully operated counting armatures in fully operated condition.

At its back contact, relay 85 extends ground potential to contact spring 32 in the off-normal stackup, thereby sounding buzzer 86 as a call signal. At the same time, ground potential is extended to contact springs 32 in stackups S1 to S10, thereby closing a circuit through one or another of the contact pairs 43, 54 to light the lamp 87 corresponding to the number of impulses received and counted.

When the transmitted signal is to be extinguished, key 82 is restored to normal position, whereupon line relay 83 restores, followed a moment later by the restoration of release relay 84. Series relay 85 operates incidentally at this time, and a further impulse is incidentally transmitted to magnet 13, in the interval required for release relay 84 to restore.

When release relay 84 restores, it open-circuits relay 85, magnets 13 and 17, call buzzer 86, and the lighted one of the lamps 87. Relay 85 restores a moment later.

Referring again to the concerned structural drawings, upon the described deenergization of hold magnet 17 and the consequent demagnetization of hold bar 20, all operated ones of the armatures 56 are released and are restored to their illustrated normal condition by the concerned contact springs.

*Bank construction*

Referring now particularly to Figs. 10 to 20, and to the auxiliary views associated with Figs. 10 to 19, the construction permitting the parts comprising stackups S1 to S10 of the device to be assembled into a compact, economically produced bank will be described. This bank assembly is held in position by threaded bolts 40 (Figs. 5, 7 and 8) which pass through the five aligned openings in the parts illustrated in Figs. 10 to 20. The preferred arrangement is that the parts illustrated in Figs. 10 to 18 are preassembled in bank form and securely held together by three bolts 40 passing downwardly through the outside and center bolt openings in the parts illustrated in Figs. 10 to 17 and threaded into outside and center openings in the base member 52 (Fig. 18), following which the preassembled bank is placed on the upper arm of frame member 12; with the lower ends of the three assembled bolts passing freely into the outside and middle bolt openings in the frame member; and with the assembly shown in Fig. 19 located between the preassembled bank and the frame member. Following this, the two remaining bolts 40 may be passed down through the intermediate bolt openings (second and fourth), and threaded into the correspondingly tapped openings in the upper arm of frame member 12 to securely hold all parts of the bank assembly in the desired assembled position illustrated in Figs. 1, 5, 7, and 8.

Top plate 41 (Fig. 10) is engaged by the heads of the bolt 40 in assembled position to receive the thrust of the tightened bolts. Insulation strip 42 (Fig. 11) lies directly beneath top plate 41 to insulate from this plate the individual upper contact springs included in the assembly shown in Fig. 12, which assembly lies below insulating strip 42 in the assembly bank.

The assembly shown in Figs. 12 and 12A includes a strip of insulating material with the illustrated five bolt openings therethrough, through which the strip is maintained in its desired aligned position in the assembled tank. Each of the contact springs 43 is attached in fixed position to the upper side of the insulating strip 44, as by tabs 72 formed by punching them out of the spring material, leaving openings therein indicated at 71. The lateral position of the springs on the strip is conveniently maintained by having the retaining tabs lie in opposed notches in the edge of the strip 44, one such notch being shown at 73. Each of the springs 43 has opposed arcuate notches between its openings 71, leaving substantial clearance between the spring and the assembly bolts, to avoid accidental contact and arcing from spring to bolt.

Spacing member 45 (Fig. 13) lies between the assembly shown in Fig. 12 and the assembly shown in Fig. 14. Strip 45 may be of metal, but is preferably of insulation, as indicated, to avoid danger of contact between it and the pair of fastening tabs 75 of assembly 14 if such a tab should be incorrectly formed. These tabs are received in openings 74 in strip 45.

The assembly shown in Fig. 14 includes the comb structure wherein the ten lower contact springs 54 of the stackups S1 to S10 are the teeth portions, and the interconnecting back portion is 47. The bolt openings through the back portion 47 of the comb structure are substantially larger than the diameter of mounting bolts 40, whereby the comb structure is maintained out of electrical contact with such bolts. The upper portion of this assembly is the insulating strip 46, which is notched at the ends, and is secured to the comb structure by a pair of overlying tabs 75, formed integrally with portion 47 of the comb structure. Strip 46 had bolt-size openings, smaller than those of parts 47 and 48, and concentric therewith, whereby the assembly is accurately positioned in the bank.

Transverse terminal strip 55 (Figs. 5, 14, and 14A) is attached underneath the back portion 47 of the comb structure, as by spotwelding; it provides a convenient attaching point for a conductor common to all of the lower contact springs 54. A forwardly extending portion of the terminal strip 55 underlies the contact spring 54 of stackup S10 of the device, thereby giving this contact spring added stiffness to enable sufficient contact pressure to be built up between this spring and its cooperating contact spring when the tenth impulse of a series is received and counted. This stiffening arrangement is neither required nor desired for the preceding contact springs 54, because of the previously described arrangement whereby the normal restoring tension of the upper contact spring 43 in the next succeeding stackup is there employed to secure the desired contact pressure. The forward spring portion of member 55 may be secured to the overlying contact spring 54, as by spotwelding at points 76.

The assembly shown in Fig. 14 further includes the spacing strip 48, of the same thickness as terminal strip 55. Spacer strip 48 may be attached to the portion 47 as by spotwelding; it has enlarged bolt openings corresponding to those in part 47, and for the same reason.

The insulating strip 49 (Fig. 15) underlies the assembly shown in Fig. 14, and the spacing strip 50 (Fig. 16) lies underneath strip 49.

The next lower portion of the bank assembly is shown in Fig. 17. It comprises the ten armatures 56, each of which is attached to a forwardly extending blade portion of the spring member 51, as by spotwelding at points 77. It is to be noted that each of the armatures 56 is considerably wider at the rear portion. This widened arrangement serves to reduce any tendency of an armature to rotate about its longitudinal axis incidental to its described movements, and it also increases the cross-sectional area of the magnetic air gap seen readily in Figs. 7 and 8 between the rear end of the armature and the front face of the base strip 52.

The assembly of Fig. 17 includes also the bracket 57 attached to the first of the armatures 56 and the brackets 60 attached to the remaining armatures 56. These brackets may be attached as by spotwelding at points 78. These brackets have the previously mentioned insulators 59, 62, and 64 attached to the arms thereof.

The base member 52 (Fig. 18), which underlies the parts illustrated in Figs. 10 to 18, has a pair of small tapped openings 79 at the left end thereof, in addition to the five bolt openings 80. The openings 79 are used to attach the off-normal assembly ON in the manner customary for the mounting of individual stackups of contacts on telephone relays.

It is to be noted that the outside and center ones of the bolt openings 80 are each tapped to threadedly receive the threaded portion of a bolt 40, while the intermediate ones of the bolt openings 80 are each enlarged to freely receive the end of a bolt 40. By this arrangement, five similar mounting bolts 40 of the same length may be used; yet only three of them threadedly engage base strip 52, and the second and fourth threadedly engage only the corresponding openings in frame member 12.

The assembly shown in Fig. 19 includes the ten stop-support springs 65, which are formed integrally with the rear portion 53. For stiffening purposes, the edges of the forward portions of support springs 65 are turned upwardly as shown in Figs. 1, 19, and 19A. The stop members 66 are attached underneath the forward ends of the support springs 65, as by spotwelding at points 91.

In Fig. 20, the five openings in frame 12 for mounting bolts 40 are shown. The second and fourth are tapped for threaded engagement, while the first, third, and fifth are enlarged to the bolt diameter. The five bolts 40 cooperate with these openings to determine the horizontal location of the assembled bank structure on the frame 12.

In Fig. 20, terminals 67 and 68 of magnets 13 and 17 may be seen, as well as the rear mounting screws 14 and 18 of these magnets.

*Second embodiment*

Referring now particularly to Figs. 21 to 26, the second embodiment of the improved counting device will be described.

In general operating principle and structure, the second embodiment of the counting device is similar to the first. That is, an armature is caused to execute a plurality of movements successively, the final one of which causes the next succeeding armature to execute the first of its movements between impulses by virtue of a mechanical interconnection between adjacent armatures. The principal difference is that the inflexible mechanical interconnection between adjacent armatures in the first embodiment is replaced by a resilient interconnection in the second embodiment, whereby an armature, upon responding to its pertaining impulse, is permitted to apply force to such resilient interconnection which force is stored therein until the instant impulse is terminated, whereupon the stored force causes the next succeeding armature to move from normal position, above the magnetic center line, to advanced position, below the magnetic center line. This arrangement requires only two movements of an armature, (1) an advance movement at the termination of the preceding impulse and (2) a final movement upon the receipt of the pertaining impulse. Moreover, the modified arrangement renders the movable stops 66 of the first embodiment unnecessary, and renders feasible the employment of a single electromagnet 102 and the employment of a single impulse bar 118 and attached yoke 114 through which both the holding flux and the impulse flux are applied.

In the drawings of the modified embodiment, Figs. 21 to 25, 101 is the frame member; 102 is the single electromagnet; 103 are the winding terminals of such magnet; 104 is the rear mounting screw of the magnet; 105 is the rear or holding winding; 106 is the front or impulse winding; and 107 is a center-pole member which fits closely around the magnetic core of the electromagnet intermediate the windings 105 and 106 and terminates comparatively close to the lower arm of frame member 101, thereby placing a considerable magnetic shunt around the portion of the magnet core encircled by the holding winding 105, for a purpose to be discussed.

The magnetic air gap between the adjacent faces of frame 101 and center-pole member 107 is maintained constant by the non-magnetic spacing strip 109, through which pass non-magnetic screws 108, holding parts 107, 109, and 101 together. The rectangular front pole piece 118 is secured to magnet 102 by screw 119 (Fig. 21). Pole piece 118 is maintained accurately spaced with respect to frame 101 by non-magnetic feet 110 attached to 118 by rivets 112, and to the frame 101 by screws 111.

Magnetic yoke 114 is removably attached to front pole piece 118 by screws 113. Yoke 114 is notched to provide inspection and adjustment access to the movable members, leaving ten control extensions 115, one for each of the stackups S1' to S10'.

Each of the extensions 115 is formed to provide an upper pole portion 116 and a lower pole portion 117, through which portions movement of the associated armature 131 is controlled.

As seen in Figs. 24 and 25, the members of the bank construction held in place by bolts 120 (Fig. 22) include the top plate 121, the common interconnecting (comb-back) member 122 for the armature springs 132; insulator strip 123; insulator strip 124 on which the upper contact springs 133 are separately secured substantially as shown in Fig. 12 for springs 43; spacer strip 125; lower-spring insulator strip 126; comb portion 127 with which the lower contact springs 134 are integrally formed substantially as shown in Fig. 14 for the springs 54; spacer 128 corresponding to part 48 (Fig. 14); lower insulating strip 129; and base member 130. The five bolts 120 afford a magnetic interconnection between top plate 121 and frame member 101, affording a magnetic return path from the rear portions of armature 131 and frame member 101.

As shown in Fig. 24 for the stackup S1', and in Fig. 25 for the stackup S2', each stackup includes an armature 131, spring-supported at the rear by being spotwelded to its underlying armature spring 122, an armature spring 132 which has a forwardly extending portion underlying the armature, an upper bushing 139 depending from spring 132; an upper contact spring 133; and a lower contact spring 134. As seen best in Figs. 21 and 22, each stackup S1' to S10' also includes an arm interconnecting the upper portion thereof with the immediately preceding stackup. This arm is shown at 135 for stackup S1' and at 137 for each of the succeeding stackups. One end of such arm overlies the front end of the associated armature spring 132 and may be affixed thereto as by spotwelding at points 144 (Fig. 22). As shown in Fig. 22 in connection with stackup S5', an opening may be provided in the concerned end of each arm 135 or 137 to receive the reduced portion by which the upper end of bushing 139 is attached to the associated armature spring 132.

The left end of arm 135 carries a depending bushing 136 by which contact spring 142 of off-normal stackup ON' is brought into engagement with the associated contact spring 143 when the armature 131 of stackup S1' responds to the first impulse. The left end of each of the arms 137 for stackups S2' to S10' is offset downwardly to underlie the lower contact spring 134 of the preceding stackup, being separated from such contact spring by a bushing 138.

Armature 131 of stackup S1' has a spacing member 140 attached thereto with a comparatively long forward end turned up (Fig. 24) against the lower face of the associated upper pole portion 116 whereby such armature 131 is normally maintained below the magnetic center line of pole portions 116 and 117, closer to portion 117 than to portion 116. Each of the armatures in stackups S2' to S10' has a spacing member 141 with a comparatively short upturned end, whereby each such armature is maintained a substantial distance above the magnetic center line, closer to its associated pole portion 116 than to its lower pole portion 117. Each of the spacing members 140 and 141 may be secured to its respective armature as by being spotwelded at points 145 (Fig. 22).

In Fig. 26, showing the modified construction used in a simple signaling system similar to that shown in Fig. 9, the parts 81' to 87' correspond respectively to the parts 81 to 87 of Fig. 9.

*Operation*

When a signal is to be transmitted over the line illustrated in Fig. 26, line and release relays 83' and 84' respond successively to the closing of the contacts of key 82'. At its left contact, release relay 84' prepares a circuit for series relay 85' and for winding 106 of electromagnet 102 of the counting device. At its right-hand contacts, it closes a circuit for the hold winding 105 of electromagnet 102.

When impulse contacts 81' are caused to interrupt the line circuit the desired number of times, line relay 83' momentarily restores a corresponding number of times. Slow-restoring release relay 84' remains operated during impulse transmission. Upon each restoration of line relay 83', a circuit is closed through the left-hand contacts of release relay 84' for the winding of series relay 85', and a parallel circuit for impulse winding 106 of electromagnet 102. Series relay 85' operates responsive to the first impulse and remains operated until an interval after the termination of the final impulse of the series. Upon operating, relay 85' disconnects one contact in each of the stackups ON' and S1' to S10'.

Referring again to Figs. 21 to 25, responsive to the described energization of hold winding 105 of electromagnet 102 (Fig. 25), a considerable magnetic flux is set up in the portion of the core encircled by this winding but no action of armatures 131 of stackups S1' to S10' occurs responsive to this energization because a major portion of the magnetic flux generated by winding 105 is shunted to the frame member 101 across the magnetic air gap represented by the non-magnetic spacing strip 109. The resulting flux reaching pole member 118 and attached yoke 114, while insufficient to cause actuation of any of the armatures 131, is sufficient to maintain in operated position any armature 131 operated as a result of impulses transmitted to winding 106.

*First impulse received*

Responsive to the delivery of the first impulse to winding 106 of electromagnet 102, the flux passing to and through parts 118 and 114 is increased sufficiently that the extensions 115 are each magnetized to the operating value of the armatures 131. At this time, the armature in each of the stackups S2' to S10' is above the magnetic center line and therefore remains in normal position, being attracted upwardly against its spacing member 141 by the associated pole portion 116. The armature 131 in the stackup S1', however, being normally maintained below the magnetic center line by spacing member 140, is immediately attracted downwardly into engagement with the associated pole portion 117. The associated armature spring 132 and attached parts 135 and 139 are thereby carried downwardly. Arm 135 (Figs. 21 to 24), through its underlying bushing 136, closes off-normal spring 142 against off-normal spring 143. The bushing 139 underlying and attached to the forward end of armature spring 133 closes upper contact spring 133 of stackup S1' with lower contact spring 134, and then imparts movement, through the closed contact springs and associated bushing 138, to the left end of offset arm 137 (Fig. 21), attached to front end of armature spring 132 of stackup S2'. The forward end of such armature spring 132 is therefore carried downwardly a distance equal to the major portion of the downward travel of the armature of the first stackup.

Each of the armature springs 132 of the second to tenth stackups is preferably tensioned slightly against its associated armature to give a trapped pressure for bringing such armature downwardly to advance position responsive to the above described downward movement of the attached arm 137. The armature of stackup S2', however, does not move downwardly for the time being, as it is being attracted upwardly by the associated pole portion 116, as pointed out. Spring 132 of such stackup therefore yields; its forward end moves downwardly away from the associated armature. During this movement, bushing 139 of stackup S2' carries the associated upper contact spring 132 close to, but not into engagement with. the contact portion of the associated lower contact spring 134.

*First impulse terminated*

When the first impulse delivered to winding 106 as explained in connection with Fig. 26 is terminated, the resulting deenergization of this winding permits the magnetic flux in portions 118 and 114 to drop to the normal holding value determined by the thickness of air-gap piece 109 and the magnetization of hold winding 105. The holding value of the flux is sufficient to maintain any armature in fully operated position, as previously noted, whereby armature 131 of stackup S1' remains in operated position notwithstanding the termination of the operating impulse.

When the flux drops to holding value, armature 132 in stackup S2' (because of the substantial air gap maintained by its spacing member 141, Fig. 25) is no longer attracted to the associated upper pole portion 116 with sufficient force to overcome the tension of its downwardly flexed armature spring 132. As a result, the said armature of stackup S2' immediately moves downwardly through the distance by which the forward end of the associated armature spring 132 was moved downwardly by its attached bracket 137, at which point the downward motion of such armature 132 ceases. The armature of stackup S2' now occupies substantially the same relative position between its associated pole portions 116 and 117 as is shown in Fig. 24 as the normal position for armature 132 of stackup S1'.

As explained in connection with the similar parts of the first embodiment, the upper contact spring 133 of each stackup S2' to S10' is tensioned upwardly sufficiently to maintain the desired contact pressure between the forward end of armature springs 133 and 134 of the preceding stackup, acting through the concerned offset arm 137.

As a result of the receipt of the first impulse the contact pairs of stackups ON' and S1' have been closed, and the armature of the second stackup S2' has been moved to advanced position responsive to the termination of such impulse.

*Second impulse received*

If the impulse series being counted contains a second impulse, upon the receipt of such second impulse by winding 106, parts 118 and 114 are again strongly magnetized, whereupon the armature of stackup S2' moves downwardly from its above-described advanced position into engagement with the upper face of the associated pole portion 117. When this occurs, the resulting downward movement of the attached arm 137 permits the downwardly tensioned lower spring 134 of stackup S1' to move downwardly out of contact with the associated upper contact spring 133, thereby opening the contact pair in the first stackup at the beginning of the final movement of the armature in stackup S2'. The final movement of the armature in stackup S2' also brings the forward end of the contact springs 133 and 134 in such stackup into engagement, and then, through the arm 138 secured in the third stackup, causes a downward flexing movement of the forward end of armature spring 132 of such third stackup, as explained in connection with armature spring 132 of stackup S2'.

*Second impulse terminated*

Upon the termination of the second impulse, the armature of stackup S2' remains in its fully operated position, and the armature 132 in the third stackup S3' moves downwardly into advance position, as was explained in connection with the advanced movement of the armature of stackup S2'.

*Succeeding impulses*

If the impulse series under consideration contains succeeding impulses, the armatures of the concerned succeeding stackups S3' to S10' respond thereto as described hereinbefore for stackup S2'. That is, each such armature executes its final movement responsive to the pertaining impulse, having executed its advance movement responsive to the cessation of the immediately preceding impulse. The contact pair directly associated with any such armature is not closed responsive to the advance movement of such armature; is firmly closed responsive to the final movement of such armature; and is again opened responsive to the beginning of the final movement of the next succeeding armature, if a further impulse is received.

In the signalling system as disclosed in Fig. 26, when line relay 83' comes to rest in an energized condition at the end of the series of line interruptions, it maintains the winding of release relay 84' energized continuously and maintains open the circuit of series relay 85' and the circuit of impulse winding 106. A moment later, series relay 85' restores and applies ground potential to one contact in each of the stackups ON' and SI' to S10'. When this occurs, the buzzer 86' sounds because contacts ON' have been closed, and one or another of the signal lamps 87' is lighted according to which of the stackups S1' to S10' contains closed contacts, depending upon the number of impulses which have been transmitted to the counting device.

When key 82' is subsequently opened to clear out the system, line and release relays 83' and 84' restore successively. Series relay 85' is operated temporarily responsive to a circuit closed in the interval required for release relay 84' to restore. It thereupon open-circuits the buzzer 86' and the lighted lamp 87'. When release relay 84' restores, it open-circuits both windings of electromagnet 102, to complete the clearing-out operation.

Referring again to Figs. 21 to 25, when both windings 105 and 106 of electromagnet 102 are opened, the magnet completely deenergizes, completely demagnetizing parts 118 and 114. All of the armatures 131 thereupon restore to their respective normal positions, along with their associated parts.

Referring again to the hold and impulse windings 105 and 106 as shown in Fig. 25, the principal reason for providing the center pole member 107 in place of providing a relatively weak (low ampere-turn) hold winding 105 and a relatively strong (high ampere-turn) impulse winding 106, either tandem related or concentrically related on a simple core structure, is that such an arrangement does not respond quickly to the receipt of an impulse or to the termination thereof because of the well-known retarding action of a magnetic core encircled by a winding whose circuit is closed. That is, when two windings encircle the same core, and one of them has a closed circuit, induced current in such winding tends to retard any change in the flux passing through the portion of the core which it encircles. Such an arrangement therefore is satisfactory only for impulses of considerable length separated from each other by a considerable time interval, unless the holding winding is rendered comparatively inefficient with a high ratio of resistance to ampere turns, in which case the induced-current effect is lessened. With the disclosed construction, however, with center pole 107 provided to give a comparatively low-reluctance magnetic shunt path around the portion of the magnet core encircled by the hold winding 105, the impulse winding 106 can produce rapid flux variations in the associated end of the magnet core, which variations pass through the shunt path represented by the center pole member 107 without materially affecting the flux passing through the hold winding 105.

Windings 105 and 106 may be similar, in which case each tends to generate the same amount of flux (the same number of lines of force). There is then little or no variation in the flux passing through the portion of the core encircled by the hold winding 105 incidental either to the receipt of impulses by winding 106 or to the termination thereof. Upon the receipt of an impulse, the considerable portion of flux generated by hold magnet 105 and normally passing to frame member 101 by way of the center pole member 107, immediately changes direction and joins the holding flux passing through the portion of the core encircled by winding 106. Then, when the impulse is terminated, the diverted flux immediately resumes its normal path through center pole piece 107 to frame member 101, across the air gap represented by the spacer strip 109.

Referring generally to the two embodiments illustrated in the drawings, it is to be noted that the armatures 56 and 131 are of reduced cross-sectional area for a major portion of their length. This operates to increase the reluctance of the magnetic path through an armature, thereby considerably reducing the amount by which the flux through an armature increases as a result of air-gap reduction consequent upon the movement thereof. Preferably, the total cross-sectional area of all the armatures of the device is less than the cross-sectional area of the magnetic path at any other point. These two provisions tend to reduce the variation in effective magnetomotive force consequent upon a number of preceding armatures having been operated.

I claim:

1. In a magnetic counting device including a pole structure and means for transmitting a series of magnetizing impulses thereto, armatures associated with said pole structure and corresponding respectively to said impulses, each armature being movable in its turn by magnetic force emanating from said pole structure to count the corresponding impulse, means normally maintaining each armature except the first out of the effective operating field of the pole structure and for normally maintaining the first armature within such field, whereby only the first armature moves to count the first impulse, and means for preliminarily advancing further armatures successively into the effective operating field of the pole structure during the counting operation in timed sequence with their respective corresponding impulses.

2. In a magnetic counting device including a pole structure and means for transmitting a series of magnetizing impulses thereto, armatures associated with said pole structure and corresponding respectively to said impulses, each armature being movable in its turn by magnetic force emanating from said pole structure to count the corresponding impulse, means normally maintaining each armature except the first out of the effective operating field of the pole structure and for normally maintaining the first armature within such field, whereby only the first armature moves to count the first impulse, and means effective during each inter-impulse interval for moving the next succeeding armature from its normal position to an intermediate position within the effective operating field of the pole structure.

3. In a magnetic counting device including a pole structure and means for transmitting a series of magnetizing impulses thereto, armatures associated with said pole structure and corresponding respectively to said impulses, each armature being movable in its turn by magnetic force emanating from said pole structure to count the corresponding impulse, means normally maintaining each armature except the first out of the effective operating field of the pole structure and for normally maintaining the first armature within such field, whereby only the first armature moves to count the first impulse, and means responsive to the termination of the impulse counted by any armature except the last for moving the next succeeding armature from its normal position to an intermediate position within the effective operating field of the pole structure.

4. In a magnetic counting device including a pole structure and means for transmitting a series of magnetizing impulses thereto, armatures associated with said pole structure and corresponding respectively to said impulses, and interarmature coupling means extending between adjacent armatures, each armature being movable in its turn by magnetic force emanating from said pole structure to count the corresponding impulse, each armature after the first being controlled through the concerned interarmature coupling means, dependent upon the preceding armature having executed its said counting movement, to execute a préliminary movement responsive to the termination of the impulse preceding the one to which it corresponds, such preliminary movement rendering the concerned armature operative to execute a counting movement responsive to the next succeeding impulse.

5. In a magnetic counting device including a pole structure and means for transmitting a series of magnetizing impulses thereto, armatures associated with said pole structure and corresponding respectively to said impulses, and interarmature coupling means extending between adjacent armatures, each armature being movable in its turn by magnetic force emanating from said pole structure to count the corresponding impulse, each armature after the first being controlled through the concerned interarmature coupling means, dependent upon the preceding armature having executed its said counting movement, to execute a preliminary movement rendering its operative to execute a counting movement responsive to the next succeeding impulse.

6. In a magnetic counting device according to claim 1, means interlinking each said further armature to the next preceding armature, said interlocking means serving to impart the said preliminary movement to an armature responsive to movement of the next preceding one.

7. In a magnetic counting device according to claim 1, lost-motion means interlinking each said further armature to the next preceding armature, said interlinking means serving to impart the said preliminary movement to an armature responsive to movement of the next preceding one, the lost motion in any interlinking means serving to reduce the directly resulting motion of the driven armature of an interlinked pair by an amount substantially equal to the movement of the driving armature from its preliminary advanced position to final position.

8. In a magnetic counting device according to claim 1, means for stopping and holding any armature preceding the last armature of the device in a pre-final position until its corresponding impulse subsides, means thereupon effective for continuing the movement of such armature to final position, and interlinking means responsive to the last-named movement for imparting the said preliminary movement to the next succeeding armature.

9. In a magnetic counting device according to claim 1, means flexibly coupling each armature preceding the last armature of the device with the next succeeding armature, each armature preceding the last serving to apply force to the coupling between it and the next succeeding armature incidental to the execution of its movement to count the corresponding impulse, means for restraining the concerned succeeding armature from responding to such force until the instant impulse is terminated, such armature thereupon yielding to the said applied force by preliminarily moving into the effective operating field of the pole structure, whereby it executes its counting movement responsive to its corresponding impulse, next succeeding.

10. In a magnetic counting device including a pole structure and means for transmitting a series of magnetizing impulses thereto, armatures associated with said pole structure and corresponding respectively to said impulses, each armature being movable in its turn by magnetic force emanating from said pole structure to count the corresponding impulse, means normally maintaining each armature except the first out of the effective operating field of the pole structure and for normally maintaining the first armature within such field, whereby only the first armature moves to count the first impulse, each armature preceding the last having a first contact member and a second contact member associated therewith, each such armature serving pursuant to its counting movement to move its first contact member into electrical engagement with its second contact member and to impart movement to its second contact member through pressure applied by way of its first, and means linking each said second contact member to the next succeeding armature to move such armature into the effective operating field of the pole structure preliminary to the counting of the corresponding impulse, next succeeding, by such armature.

11. In a magnetic counting device according to claim 10, wherein the concerned linking means serves pursuant to the counting movement of such armature to move the second contact member of the preceding armature out of electrical engagement with its associated first contact member.

12. In a magnetic counting device, a pole structure providing a pair of opposed pole faces, armatures disposed side by side between said pole faces, means normally maintaining all said armatures in a normal position nearer to the first pole face than to the second, means for transmitting a series of magnetizing impulses to said pole structure, each armature in normal position when an impulse is received being retained in such position by the greater attraction of the nearer pole face, means effective between the first and second impulses for advancing the first said armature from its normal position to an advanced position nearer the second pole face than to the first; said first armature executing a counting movement from advanced position toward the second pole face responsive to the next succeeding impulse, and interlinking means extending from each said armature preceding the last to the next succeeding one and effective between impulses to move the latter armature from its normal position to its advanced position incidental to the said counting movement of the concerned armature.

13. In a magnetic counting device, a pole structure providing pole faces, a first armature operatively associated with one pole face, other armatures disposed between pole faces, means normally maintaining each of said other armatures in a normal position wherein it is nearer to one pole face than to another, means for transmitting a series of magnetizing impulses to said pole structure, the first armature operating responsive to the first impulse by moving toward its associated pole face, while each said further armature is then held in normal position by the greater attraction of its nearer pole face, interlinking means extending from each armature preceding the last to the next succeeding one, and means controlled through said interlinking means for bringing each further armature from its normal position into operative association with its other pole faces responsive to the termination of the impulse serving to operate the preceding armature, whereby said armatures are operated successively responsive to said impulses respectively.

14. In a magnetic counting device, a pair of electromagnets comprising an impulse magnet and a hold magnet, a series of armatures arranged side by side in a plane lying to one side of said magnets, each armature being mounted at the rear end so as to permit movement of the front end transversely of said plane, the rear end of each armature being magnetically associated with the rear end of said magnets, a hold bar magnetically associated with the front end of said hold magnet and underlying a portion of said armatures at a sufficient distance that the armatures are normally out of its effective field, an impulse bar offset from said hold bar and magnetically associated with the front end of said impulse magnet, said impulse bar more closely underlying said armatures but at a sufficient distance that all armatures succeeding the first are normally out of its effective field, means for energizing the hold magnet and for intermittently energizing said impulse magnet a desired number of times, the first armature responding to the first impulse by moving into the effective field of said hold bar whereby it is retained operated thereafter, and means including interarmature linkage means for moving further armatures successively into the effective field of the impulse bar between impulses, whereby each such further armature is moved into the effective field of the hold bar responsive to the next succeeding impulse.

15. In a magnetic counting device, an electromagnet having a hold winding and an impulse winding, a series of armatures arranged side by side in a row, each armature being mounted at the rear end so as to permit movement of the front end transversely of said row, the rear end of each armature being magnetically associated with the rear end of said magnet, a combined impulse and hold bar magnetically associated with the front end of said magnet, said bar having a first portion underlying all said armatures and having a second portion more closely overlying all said armatures except the first, restoring means constantly tending to hold all armatures in normal position by urging them away from the underlying portion of said bar, said hold winding serving, when energized, to magnetize said bar weakly, but with sufficient strength to hold any armature which has been moved into close association with said underlying portion thereof, said impulse winding serving, when intermittently energized a desired number of times, to magnetize said hold bar sufficiently to attract downwardly any armature which stands nearer to the underlying portion than to the overlying portion, and to retain in normal position any armature which stands nearer the overlying portion than to the underlying portion, the first armature responding to the first impulse by moving into close association with said underlying portion, whereby it is retained operated thereafter, and flexible interarmature linkage means effective between impulses to move further armatures successively across the midpoint between said portions, whereby each such further armature is subsequently moved into close association with the underlying portion responsive to the next succeeding impulse and is held by said hold magnetization following such impulse.

16. In a magnetic counting device, an electromagnet having a hold winding encircling one portion thereof and an impulse winding encircling another portion thereof, a series of armatures associated with said magnet, the ends of each armature being magnetically associated respectively with the ends of said magnet; said magnet serving, when magnetized weakly, to hold any armature which has been operated by failing to operate any of them; means, including interarmature coupling means, for causing said armatures to operate successively responsive respectively to successive strong energizations of said magnet, depending upon the weak magnetization being maintained between such strong magnetizations; and means providing a low-reluctance magnetic shunt path around the portion of said magnet encircled by said hold winding, whereby a strong energization of said hold winding produces but the desired weak magnetization of said magnet as a whole, said shunt path serving as a low reluctance by-pass around the hold portion of the magnet for the rapid rise of magnetic flux generated by energization of the impulse winding and a rapid decline of such flux upon deenergization of such winding in spite of any retarding effect of a closed circuit path through the hold winding, whereby said armatures respond successively to short impulses separated by short intervals.

17. In a magnetic counting device including a pole structure and means for transmitting a series of magnetizing impulses thereto, armatures associated with said pole structure and corresponding respectively to said impulses, each armature being movable to count its corresponding impulse responsive to the resulting impulse of magnetic force emanating from said pole structure, means normally preventing each armature except the first from moving to count any said impulse of force, and means prepared responsive to each said force impulse preceding the last, and rendered effective responsive simply to the termination thereof, for nullifying said preventing means with respect to the next succeeding armature.

18. In a magnetic counting device including a pole structure and means for transmitting a series of magnetizing impulses thereto, armatures associated with said pole structure and corresponding respectively to said impulses, each armature being movable to count its corresponding impulse responsive to the resulting impulse of magnetic force emanating from said pole structure, means normally preventing each armature except the first from moving to count any said impulse of force, and means prepared responsive to the counting movement of each armature preceding the last, and rendered effective responsive simply to the termination thereof, for nullifying said preventing means with respect to the next succeeding armature.

19. In a counting device, an electromagnet and a series of counting members associated therewith and corresponding respectively to the impulses of a series transmitted thereto, inter-member coupling means extending between adjacent counting members, means including the electromagnet for moving each counting member in its turn by power derived from the electromagnet to count its corresponding impulse of the series, said moving means including means for controlling each counting member after the first through the concerned inter-member coupling means, dependent upon the preceding counting member having executed its counting movement, to execute a preliminary movement responsive to the termination of the impulse preceding the one to which such member corresponds, such preliminary movement rendering the concerned counting member operative to execute its counting movement responsive to the next succeeding impulse.

20. In a magnetic counting device including a pole structure and means for operatively magnetizing it a desired number of times, armatures associated with said pole structure, means rendering said armatures attractable to said pole structure, in succession only, responsive respectively to said magnetizations thereof, and means effective between said magnetizations for maintaining said pole structure magnetized relatively weakly but sufficiently to hold the armatures which have been attracted thereto.

JOHN I. BELLAMY.

No references cited in reissue case.